(12) United States Patent
Brist et al.

(10) Patent No.: US 7,785,114 B2
(45) Date of Patent: Aug. 31, 2010

(54) MODIFICATION OF CONNECTIONS BETWEEN A DIE PACKAGE AND A SYSTEM BOARD

(75) Inventors: Gary Brist, Yamhill, OR (US); Tom Ruttan, Lake Oswego, OR (US); Ted Zarbock, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/217,077

(22) Filed: Jun. 30, 2008

(65) Prior Publication Data

US 2009/0325415 A1 Dec. 31, 2009

(51) Int. Cl.
*H01L 21/48* (2006.01)
(52) U.S. Cl. .......................... 439/71; 439/55; 361/761; 361/792; 174/255; 174/260
(58) Field of Classification Search ................ 361/761, 361/760, 792–795; 174/255, 260–262; 439/71, 439/55, 66
See application file for complete search history.

(56) References Cited

U.S. PATENT DOCUMENTS

| | | | |
|---|---|---|---|
| 6,344,684 B1 * | 2/2002 | Hussain et al. ............. | 257/697 |
| 6,676,784 B2 * | 1/2004 | Setzer et al. ............. | 156/89.12 |
| 6,687,985 B2 * | 2/2004 | Sakamoto et al. ............. | 29/830 |
| 7,119,432 B2 * | 10/2006 | Desai et al. ................. | 257/706 |
| 2003/0062629 A1 * | 4/2003 | Moden ....................... | 257/778 |
| 2003/0214049 A1 * | 11/2003 | Hortaleza et al. ........... | 257/778 |
| 2005/0024838 A1 * | 2/2005 | Maxwell ..................... | 361/782 |
| 2005/0224955 A1 * | 10/2005 | Desai et al. ................. | 257/706 |
| 2009/0008763 A1 * | 1/2009 | Kim et al. ................... | 257/778 |
| 2009/0152704 A1 * | 6/2009 | Cablao et al. ............... | 257/686 |

* cited by examiner

*Primary Examiner*—Gary F. Paumen
(74) *Attorney, Agent, or Firm*—Blakely, Sokoloff, Taylor & Zafman LLP

(57) ABSTRACT

Modification of the connections between a die package and a system board is described. In one example a pattern redistribution module is used in a socket. The module has a first array of contacts on one side of the module. The contacts have a first configuration to connect to the socket. A second array of contacts is on another side of the module opposite the first array of contacts and has a second configuration to connect to a package containing a die. A board is between the first and the second array of contacts to interconnect contacts of the first array of contacts to contacts of the second array of contacts.

20 Claims, 8 Drawing Sheets

MODIFICATION OF CONNECTIONS BETWEEN A DIE PACKAGE AND A SYSTEM BOARD

BACKGROUND

1. Field

The present description relates to the field of sockets for microelectronic and micromechanical chip packages, and, in particular to modifying the connections between a die package and a system board using the socket or nearby components.

2. Related Art

Many computer and electronic systems, microprocessors and other electronic and micromechanical die or chips are held in a package. The package containing the die or chip is then attached to a supporting system using a socket. The socket is mounted to a motherboard, system board, logic board, printed circuit board (PCB), or a similar device. The board, being significantly larger than the package and the socket is typically constructed from lower cost, lower density materials that are capable of enduring higher mechanical and electrical stresses.

As a result of the materials used for the board, it is expensive or impossible to support a large number of electrical connections in a small space. As a result, the pins of the socket that connect to the board must maintain some level of spacing in order to meet the desired electrical and cost goals. This also requires that the package for the die also maintain the same level of spacing.

With the increasing pin counts for microprocessors, central processing units (CPU's), and other electronics and micromechanical devices, the supporting packages and sockets must be made larger in order to maintain the same spacing between connections. Otherwise the pins are too close together to meet the desired electrical and cost goals of the system board.

The larger package and socket sizes result in higher costs for the die or chip and the corresponding package. If instead the pin pitch on the PCB side of the socket is reduced, more advanced technology for the PCB is required to route the signal lines and provide proper via clearances. This more advanced technology increases costs for the socket and the system board. Additionally, a smaller pitch on the socket with present socket technology makes the socket more difficult or impossible to manufacture with the existing technology.

In current microprocessors, the die may have a bump pitch of about 150-250 μm, while the package's connection to the socket as a LGA (Land Grid Array), BGA (Ball Grid Array) or PGA (Pin Grid Array) may have a solder ball pitch of 1000-1270 μm. The system board will have the same pitch. The ball pitch of 1000 μm or more and the supporting structure make the socket large compared to the die. A die of 15 mm×15 mm may require a package of 37.5 mm×37.5 mm. This is more than six times larger than the die. The additional size of the package to match the socket increases the cost of manufacturing and distributing the packaged dies.

BRIEF DESCRIPTION OF THE DRAWING FIGURES

Embodiments of the present invention are illustrated by way of example, and not limitation, in the figures of the accompanying drawings in which like reference numbers are used to refer to like features, and in which.

DETAILED DESCRIPTION

In some embodiments, the present invention provides increased package densification through reducing pin pitch in the socket. This reduces the CPU package size and cost without impacting the technology level or cost of the system board or PCB.

According to one embodiment of the invention, a low profile LGA socket or any other socket may be attached to a packaged die through an additional PCB or interposer. The additional PCB may serve to redistribute the pin pattern, translate pin positions, or change pin density, or any combination of these between the package and the socket. The LGA side of the interposer may be structured at a contact pitch and arrangement that is optimized to the package interconnect. The ball pitch and pattern on the motherboard side of the interposer may be optimized to the system needs of the application or platform.

Such a pattern, position, or pitch interposer may alternatively be integrated into the socket rather than being implemented as a separate part. In either event, a socket with pattern, position, or pitch changing functions may also have additional features and functions attached. These may include passives for power delivery, ICs (Integrated Circuits) for signal conditioning, capacitors and resistors.

Such a PRM (Pattern Redistribution Module) socket may also have a cavity to provide clearance for Land Side Capacitors (LSCs). The PRM socket may also have contact pads outside the perimeter of its molded socket housing to provide test point access for debug or assembly pass/fail testing.

In another embodiment, the PRM may be referred to or embodied as a pitch translation socket (PTS). A PTS may change the pin pitch or density between the package and the system board. It may also change patterns, scale and size. Similarly a PRM may also be used to change the pitch as well and the scale of the connections.

Using such an interposer or socket, it is possible to scale the contact pitch on the package side or top side of the socket to be compatible with smaller, higher density packages. At the same time, the bottom side of the socket may be optimized for the routing capability of the PCB structure of the system board. This allows the system to fan out smaller pitch top contacts to a larger pitch contact pattern on the bottom of the socket that is compatible with low cost PCB technology.

The size of a die package is a significant factor in the cost of the package. On the other hand, the density of the features or spacing between and complexity of the connections is the significant factor in the cost of a system board.

Figure 1:
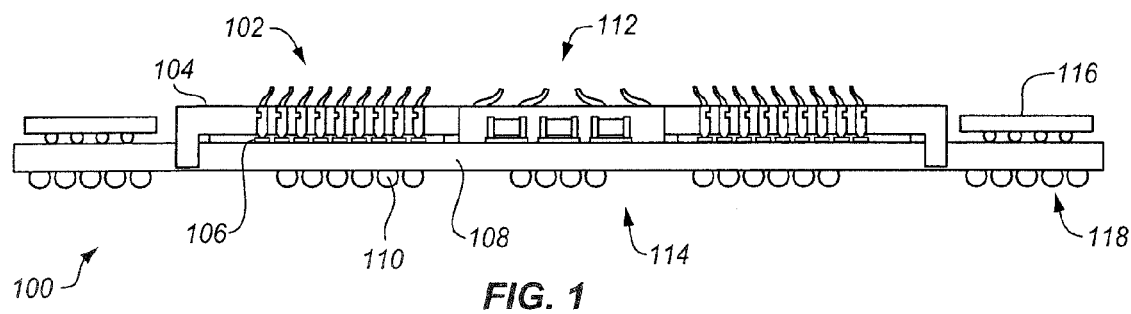
FIG. 1 is a diagram of a cross-sectional side view block of a socket including a framed pattern redistribution module according to an embodiment of the present invention.

FIG. 1 shows a cross-section of an example of a socket 100 that can redistribute the pattern of pins between a package and a system board. At the top of the socket, a set of LGA pins are configured to match the pin array on the package. In one embodiment, this pin array is the same as that on the die. This allows the package substrate to have a simple, straight, low-cost connection from the die to the socket LGA. In another embodiment, the package is conventional in that it translates the pitch of the pins on the die from a finer die pitch to a larger socket pitch. In another embodiment, the die is made larger than necessary in order for it to have a larger pin pitch that will accommodate the package.

The LGA pins extend from an LGA body 104 which contains and holds the pins and provides the structure for the resilient leaf spring mechanism of the LGA pins. For other types of connectors a different body may be used that is specifically adapted for that structure. On the bottom of the LGA body, opposite the LGA pins is an array of balls 106. These are used to make contact with a pattern redistribution module 108.

The pattern redistribution module 108 has an array of connectors on its top surface (as shown in FIG. 1) to connect with the LGA body. It has a second array of connectors 110, which in this case are solder balls, on its bottom surface to connect to the system board. The pattern redistribution module takes the arrangement of connections on its top surface and rearranges one or more of their pattern, position, and density for its bottom surface. This allows the top surface connections to be optimized for the package and the bottom surface connections to be optimized for the system board or piece to which it will be connected.

Even if the pattern redistribution module is constructed from expensive, advanced materials in order to meet the pin density and pattern design that is assigned to it, this module is very small compared to the system board. This means that the cost will be very much less than using the package pin density on the system board. Similarly, if the same redistribution functions were performed by the package, as is commonly done in current systems, then the cost is also higher because the package has unique hermetic, thermal, mechanical, and other constraints that are typically not required of a socket.

The pattern redistribution module may be constructed of a variety of different materials, including pre-impregnated (prepreg) glass fiber, ceramics, silicon, polymers, resins, etc. The particular choice of materials and construction techniques may be modified to suit any particular implementation. In one example, a high density (HD) printed circuit board material is used with multiple layers. The HD PCB allows for smaller features to be printed on the board. Power connections are routed on layers separate from input and output connections. The physical characteristics of each layer is optimized for the type of signal that it is carrying.

In the example of FIG. 1, the pattern redistribution module 108 forms the bottom surface of the socket 100. This bottom surface is configured to attach to the system board (not shown). The LGA body 104 is attached to the bottom of the module. The pattern redistribution module also allows the socket to carry additional features. In the illustrated example, the module 108 is larger than the LGA socket and carries land side capacitors 112 in a central cavity 114.

At its extremes which extend past the periphery of the LGA body, the module carries signal conditioners or repeaters 116 that drive a test point access 118 for debugging, testing and other functions. The test point access 118 may be reserved for manufacturer testing or may also be provided for complete systems to allow for diagnostic and service calls. In the illustrated example, the test point accesses feature solder balls on the bottom of the PRM to connect to the system board. The signal conditioners or repeaters are on the top surface of the PRM adjacent to the package but outside the area in which the package is held. The module may also carry a variety of passive devices, power deliver and conditioning devices, and signal conditioning devices, depending on the particular application.

Figure 2A:
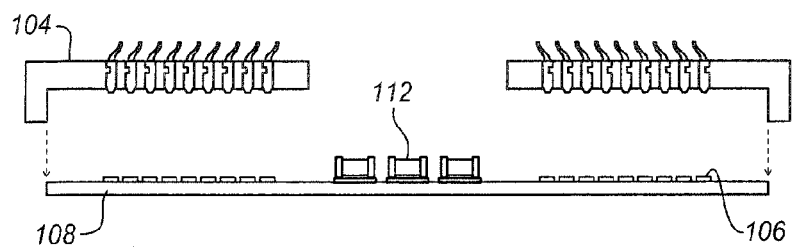
FIG. 2A is a diagram of a cross-sectional side view of grid array bodies and a pattern redistribution module prior to assembly according to an embodiment of the present invention.
Figure 2B:
FIG. 2B is a diagram of a cross-sectional side view of the grid array bodies and the pattern redistribution module of FIG. 2A after underflow according to an embodiment of the present invention.
Figure 2C:
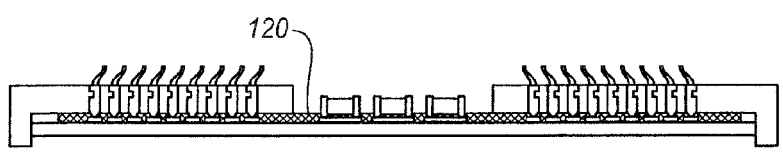
FIG. 2C is a diagram of a cross-sectional side view of the assembled grid array bodies and the pattern redistribution module according to an embodiment of the present invention.

FIGS. 2A to 2D show an example assembly flow for creating socket 100 with a pattern redistribution module 108. In FIG. 2A, a pattern redistribution module 108 is prepared with a contact array 106 and a land side capacitors 112. In FIG. 2B, an LGA socket 104 is attached to the top surface of the pattern redistribution module or PCB. This module may also be referred to in its various forms herein as an interposer. In FIG. 2C, the socket is under filled 120 where the LGA body connects to the PRM, if desired, for mechanical strength or process compatibility for secondary assembly processes.

Figure 2D:
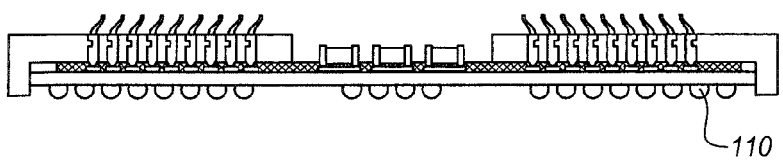
FIG. 2D is a diagram of a cross-sectional side view of the assembled grid array bodies and the pattern redistribution module after solder ball attach according to an embodiment of the present invention.

In FIG. 2D, the PRM socket then goes through ball attach on its bottom surface to attach solder balls 110 for connection to a system board. This completes the assembly. In FIG. 2D, the socket 100 does not show the test point access 118 of FIG. 1. This represents an alternative design for implementations in which test point access is not desired or in which the test point access is located in a different position that is not visible in this cross-sectional view.

Figure 3:
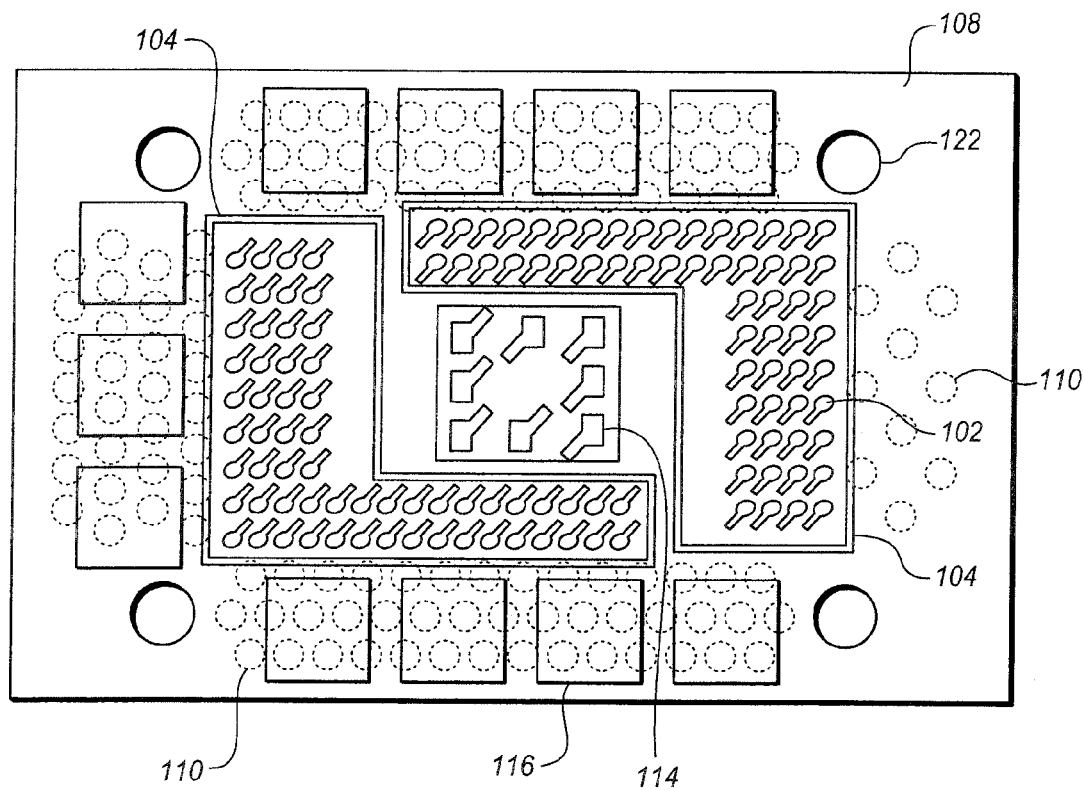
FIG. 3 is a diagram of a top view of a connector arrangement in a socket according to an embodiment of the present invention.

FIG. 3 shows a top view of the socket 100 of FIG. 1. In FIG. 1, the rectangular outline of the socket as viewed from above includes the two LGA bodies 104, each with an LGA array 102. The central cavity 114 between the LGA bodies provides room for the land-side capacitors 114. Along the periphery on three sides outside of the LGA bodies and the package connection surface, signal conditioner or repeaters 116. These may be configured for test point access or to provide a larger area for connection to the system board.

A multilayer PRM Socket such as in the example of FIG. 3 is capable of redistributing both pattern and pitch for density translation. In the illustrated examples, the redistribution renders PCB interposer 108 larger than the socket bodies 104. In the illustrated examples, there are four retention mounting holes 122 in the interposer. These are positioned internally to minimize the distance from the retention mounting posts 122 to the LGA socket contacts 102.

Figure 4:
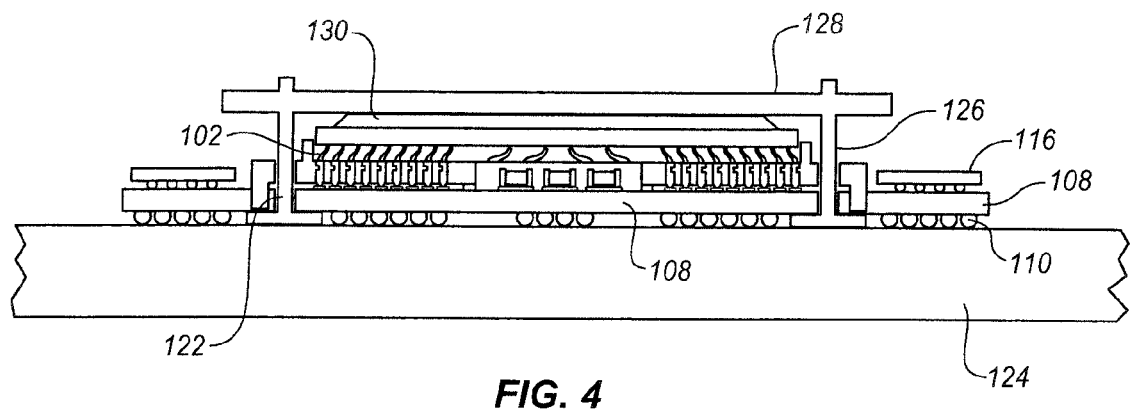
FIG. 4 is a diagram of a cross-sectional side view of the socket of FIG. 1 with a package and system board according to an embodiment of the present invention.

FIG. 4 shows the socket of FIG. 1 as mounted to a system board 124 through the solder balls 110 on the bottom of the socket. In this case, the LGA retention holes 122 are placed through the PRM internal to the socket housing to reduce the bending moments between the retention plate. Mounting posts 126 are anchored in the retention holes. A compression plate 128 is attached to the posts to span across all four mounting posts to retain a die package 130. The package may be any of a variety of different types including MMAP (Molded Matrix Array Package), CSP (Chip Scale Package), etc. The package is located between the compression plate 128 and the LGA pins 102.

As shown in this example, the compression plate is anchored only through the PRM 108 and not through the system board 124. The configuration may also be altered so that the LGA retention holes in the interposer 108 are matched with mounting holes in the system board and so that the mounting posts are attached directly to the system board (See FIG. 10). The particular design and location of the retention holes, mounting posts and compression plate may be adapted to suit any particular implementation. In addition, the system may be modified for other types of packages and package interconnections.

Figure 5A:
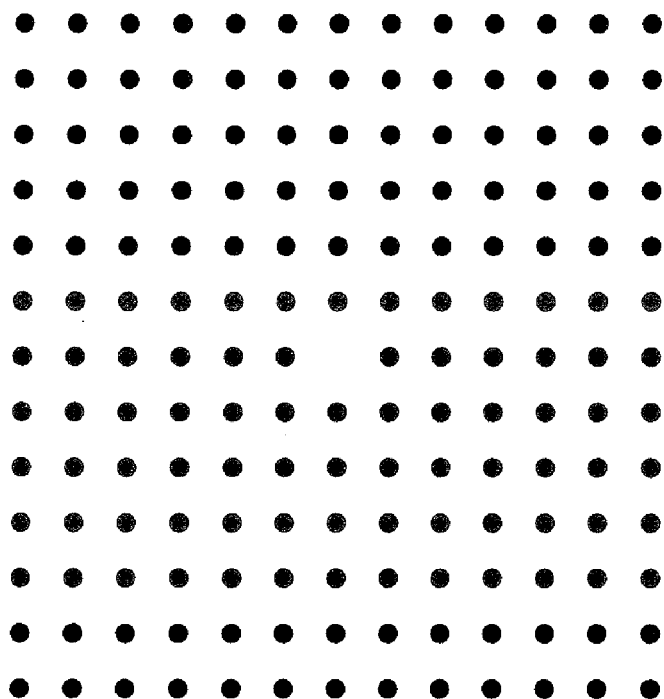
FIG. 5A is a diagram of an example pin configuration for a package side of an interposer according to an embodiment of the present invention.

FIGS. 5A to D show an example of how the interposer described above may be used to reduce the pin density from a package to a system board. FIG. 5A is a diagram of a top plan view of a conventional LGA connection pattern on a socket. In the illustrated example, the array has 13 rows and 13 columns of evenly spaced connectors. Such a pattern may be used as the top pattern 106 on the interposer 108 of e.g. FIG. 1.

Figure 5B:
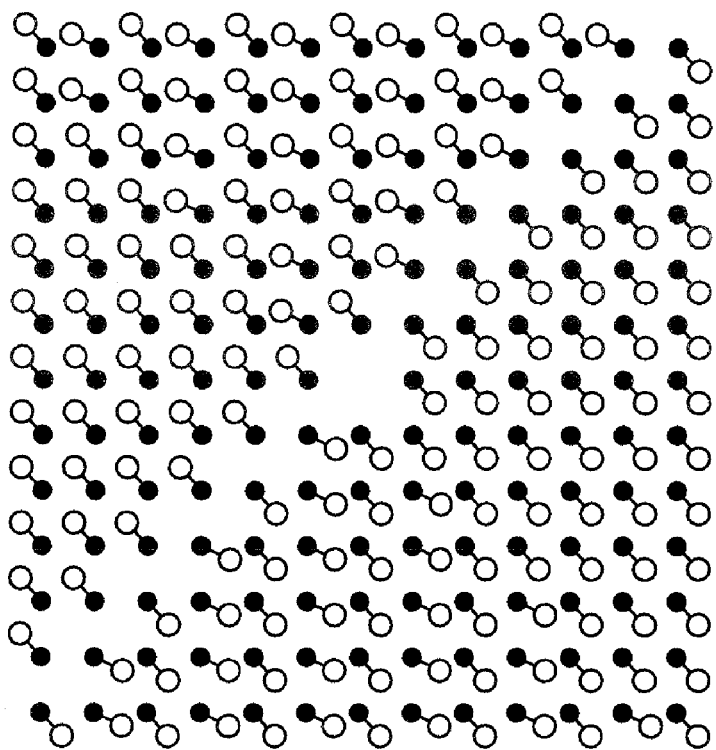
FIG. 5B is a diagram of the interposer of FIG. 5B showing adjacent vias according to an embodiment of the present invention.
Figure 5C:
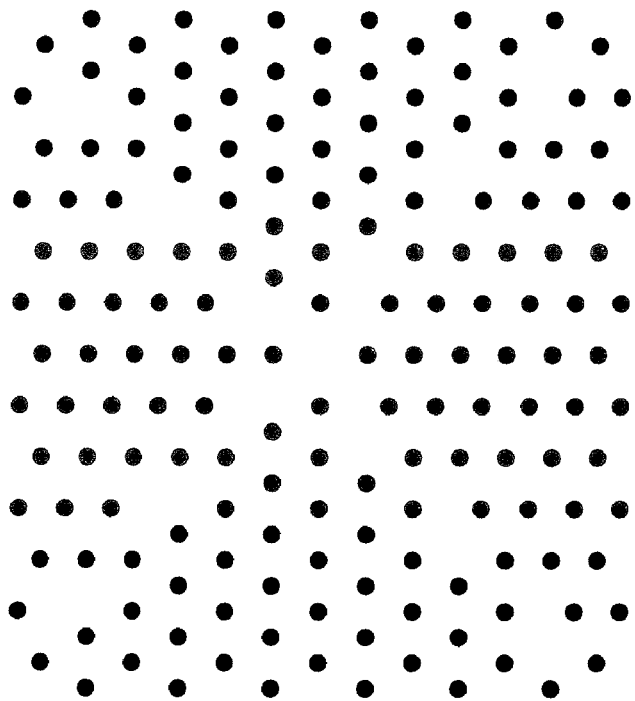
FIG. 5C is a diagram of an example pin configuration for a system board side of an interposer according to an embodiment of the present invention.

FIG. 5C shows an example diagram of a bottom plan view of the interconnection surface of the same interposer. In FIG. 5C, the pattern of pins is redistributed from the rectangular or square arrangement of the package to a staggered or hex pack arrangement on the second layer. If the drawing is viewed as a series of columns, then the pins in adjacent columns are staggered. In other words the pins of one column are vertically positioned at the midpoint of the adjacent column. The configuration can also be viewed as a series of concentric arcs. Note also that there are openings or gaps in the pattern. This allows for more space for routing within the interposer.

The interposer allows LGA sockets to provide staggered, hexagonal, and other patterns without altering the stamped pin and pin singulation processes. By redistributing rectangular contact patterns to other types of distributions, such as staggered or hex pack arrangements, it is possible to achieve higher contact density for the same set of system board design rules. In general, moving from a square contact pattern to a hex pattern while keeping the same minimum contact spacing will increase pin density by 15%. Alternatively, as shown in the FIGS. 5A and 5B moving from a square contact pattern to a hex pattern while keeping the same number of pins in the same area will increase the minimum contact spacing. A greater minimum contact spacing allows a less expensive system board technology to be used.

Figure 5D:
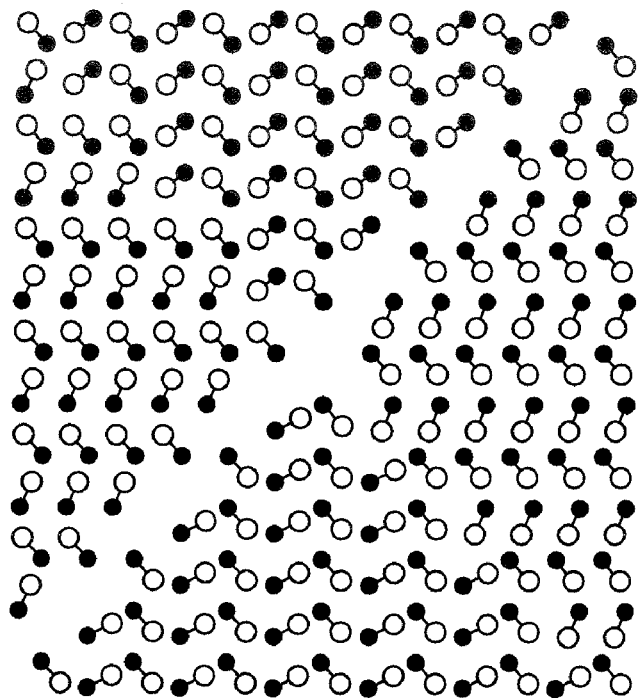
FIG. 5D is a diagram of the interposer of FIG. 5C showing adjacent vias according to an embodiment of the present invention.

FIG. 5B shows the same pin pattern as FIG. 5A and also illustrates a possible position of the vias through the interposer that allow the transition from square to hex patterns. FIG. 5D shows the same via positions together with the bottom hex pattern of FIG. 5C. As can be seen in the Figures, by positioning the vias between the top surface pin and the corresponding bottom surface pin, the translation between the two configurations requires very little translation from each pin to its respective via.

Figure 5E:
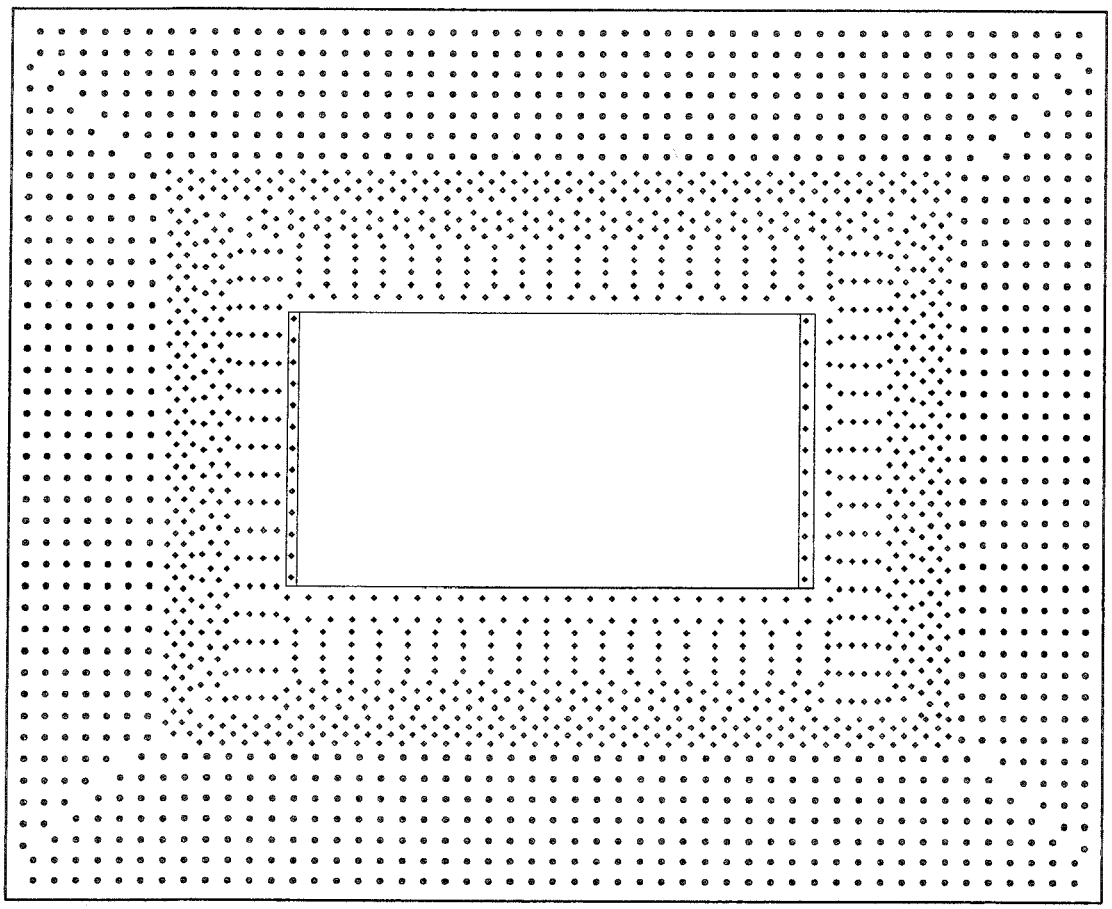
FIG. 5E is a diagram of an alternative interposer showing alternative pin configurations according to an embodiment of the present invention.

FIG. 5E shows a different aspect of possible reconfigurations that may be possible in accordance with some embodiments of the present invention. FIG. 5E is a diagram that may represent the pin configuration of either the package or system board side of an interposer or PRM. As shown in FIG. 5E, there are four different types of pin configurations in a single array. The configuration changing with distance from the center or from the outer edge. The outermost configuration of the rectangular array has an outer periphery 5 rows deep of low density pins. These are in an even rectangular configuration and in the illustrated example are seven rows and columns deep. Inside and surrounded by the outer periphery, there is another area of higher density connections.

The higher density connections are arranged in alternating rows so that that the spacing the pins in one column are arranged vertically between the pins in the next row, but are spaced apart horizontally from the adjacent columns. Because of the even rectangular pattern, it may alternatively be said that the rows are arranged horizontally between the adjacent rows, or that the pins are arranged in alternating diagonal lines. As mentioned above with the hex pack, this allows the pins to be spaced more closely. The second area is four rows and columns deep.

The third area is inside and surrounded by the second area and it has pins arranged in tight lines toward the center either horizontally and vertically. While the pins in each line are close together the lines are spaced apart. The spacing is roughly equivalent to every one or two rows being absent.

Finally, the fourth innermost area is a straight line of pins orthogonal to the inward lines. In the diagrams, this is two vertical columns of pins, one on either side of the interposer near its center. A similar line of pins in two horizontal rows might also or alternatively be provided.

There is one additional area in the center of the interposer. This area has no pins. FIG. 5E shows a rectangular area with the same aspect ratio as the periphery of the interposer that has no connectors at all. This space might be reserved for passive components, for cooling, for power connections or for other purposes.

The different areas of FIG. 5E are shown as examples of different possible configurations that may be combined in a single interposer or PRM. The different areas may be relocated or moved with respect to each other. For some applications, it may be preferred to use some configurations, but not others. For other applications, other pin configurations may be added or used in place of those shown. The central open area may instead be used also for connectors. As shown in FIG. 5E, the pins in a single interposer can be in groups with different pin pitches or densities. The pitch may also be varied across the surface of the interposer. Greater spacing between the pins, i.e. a looser configuration can be used to open up routing channels between pins. For example the third area with spaced lines allows room for routing channels between the lines. As shown for the first two areas, the outer area has more spacing than the closest and more inner area. The greater spacing in the outer area can be used to route signals between the outer pins to the denser inner pins.

Figure 6:
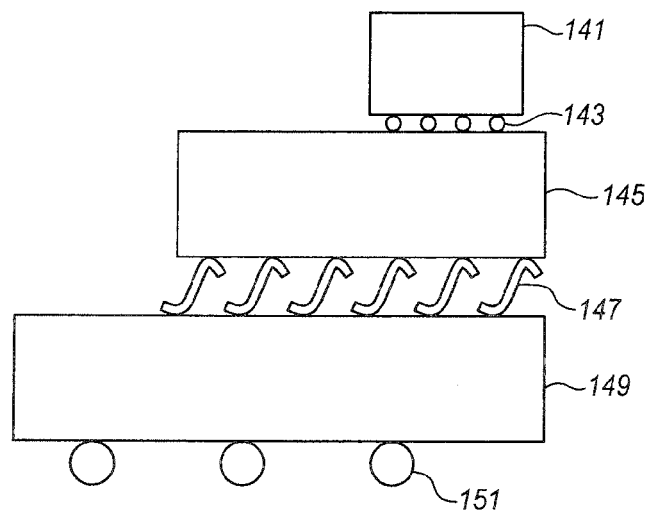
FIG. 6 is a diagram showing a hierarchy of pin density for socket-based connections according to an embodiment of the present invention.

FIG. 6 is a diagram of an application of the interposer or pattern redistribution module of embodiments of the present invention. In FIG. 6, a die 141 has a set of bottom contacts 143, such as a ball grid array to make connection with a top surface of a package substrate 145. The package substrate has a bottom set of contacts 147, such as a land grid array, to make connection with a top surface of a socket 149. In the illustrated example, the package connector are spaced farther apart than the die connectors.

The socket has a third set of contacts on its bottom surface, such as solder balls to make connection with a system board (not shown). The lower socket connectors are spaced farther apart than the upper socket or package connectors. In one example, the contact pitch of the package 145 to socket 149 interface 147 is smaller (as an example, ≦0.5 mm) than the contact pitch of the socket 149 to PCB interface 151 (as an example ≧1.0 mm).

The socket interface to the PCB is shown in this example with solder balls, but this could also be another LGA compression contact or any other suitable type of connection, depending on the particular implementation. The increase in pitch can be made through the interposer described above and provides distinct cost and reliability advantages, as mentioned previously.

Figure 7:
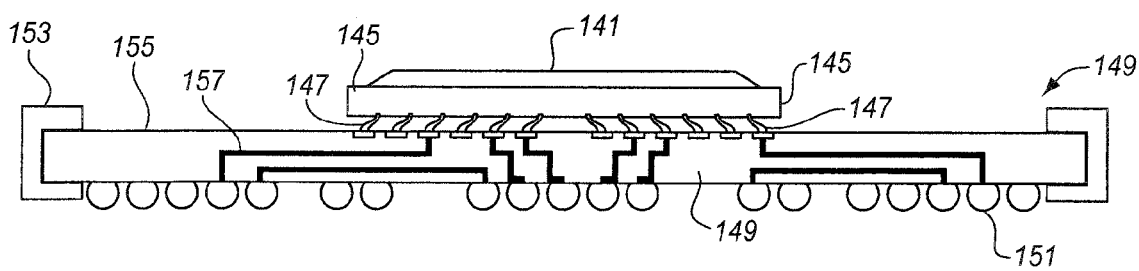
FIG. 7 is a diagram of a cross-sectional side view of an alternative socket with a package according to an embodiment of the present invention.

FIG. 7 shows another example, in cross section, of a die, package and socket connected together using the interposer described herein. As in the diagram of FIG. 6, the bottom of a die 141 is coupled to the top of a package substrate 145. In this example, the package is shown in a very simplified form as having only a substrate, however, in this and all of the other examples, the die may be much more complex and include, for example, a cover, a cooler, such as heat fins, access ports for testing, additional contacts, additional dies, and other electrical components or signal conditioners. In many applications, the package will include a cover hermetically sealed to the substrate to protect the die from environmental effects, but the particular configuration of the die is not important to the present invention.

The package substrate 145 has, in this case, a land grid array 147 to connect directly to the interposer 155. The interposer is mounted in a socket frame 153 which extends around the periphery of the interposer. The socket frame may also carry other components, as mentioned above. The socket 149 is also shown in a very simplified form. It may include additional layers, additional components, a mechanism to secure the package to the socket, etc, none of which are shown in the present drawing.

In one example, imbedded contacts are laminated to a PCB that forms the socket body. The contact shapes are defined using standard photo-etching techniques, stamped into the raise form and then laminated to the PCB body. The contact shapes are laminated where the LGA contacts are connected to the appropriate interconnections on and in the PCB.

An example of the routing, or fan out of the top contacts at the die 141 connected internally through the interposer 155 to the bottom contacts of the socket 151 is also illustrated in FIG. 7. The interposer includes conductive lines connecting each package connector to one or more solder balls. The illustrated lines have horizontal and vertical components that are particularly well suited for fabrication using PCB (printed circuit board) techniques. The horizontal lines may be produced as traces on a layer of the PCB and the vertical lines as conductive vias between the layers Depending on the pitch and the relationship of the final socket ball pattern to the starting package pattern, the interposer may be made in the form of a PCB in a low cost 2-layer PTH (Plated through hole), 4-layer design, 8-layer HDI (High density interconnect), or a variety of other technologies and designs. For an 8-layer HDI, two layers may be for interconnection. Using PCB technologies, the interposer may be about 0.5 mm thick for eight layers or 0.1 mm thick for a 2-layer version. A variety of other technologies may be used as alternatives.

Figure 8:
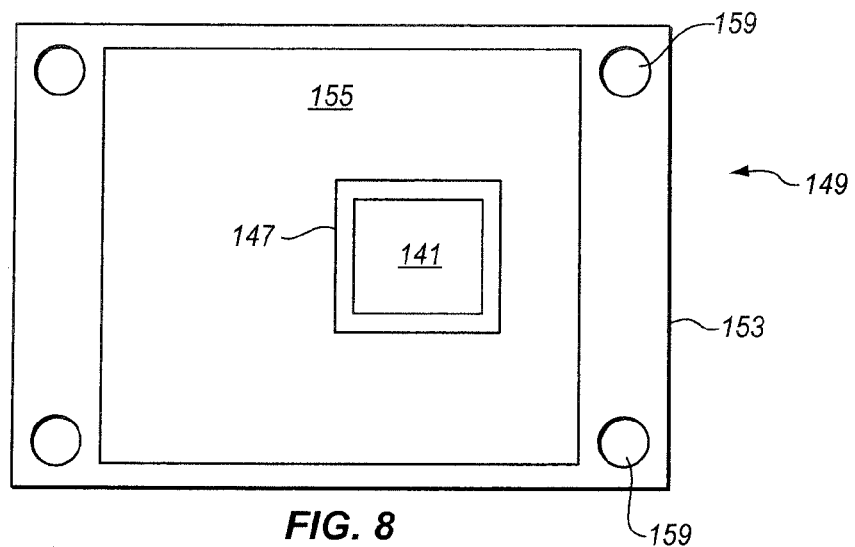
FIG. 8 is a diagram of a top view of the socket of FIG. 7 according to an embodiment of the present invention.

FIG. 8 shows again a top view of an alternative configuration suitable for the example of FIG. 7. In FIG. 8, the PCB insert 155 is held into a molded plastic frame 153 that contains the mounting holes 159 for compression loading the package to the socket. This allows a compression plate to be used similar to that of FIG. 4. The package 147 is held near the center of the socket and the package carries the die. In this example, the socket is shown as having approximately eighteen times the area of the package. This represents a significant reduction in the size and cost of the package.

Figure 9:
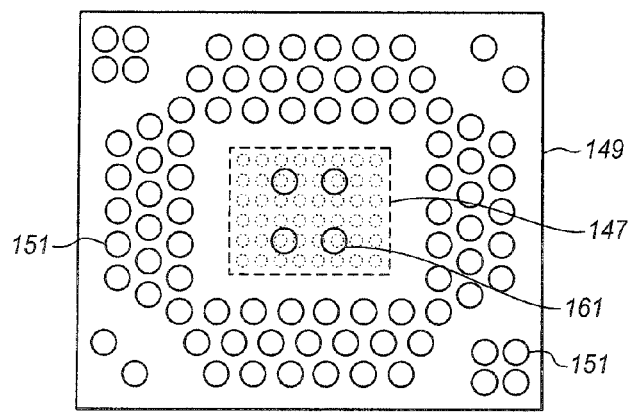
FIG. 9 is a diagram of a bottom view of a pin configuration of a socket according to an embodiment of the present invention.

FIG. 9 is a diagram of an example pitch density translation that may be achieved using the interposer of FIG. 7. The diagram shows an example pin pattern for the package 147 superimposed on an example pin pattern for the system board 151. Many different patterns are possible. This example is intended to illustrate only one of many possibilities.

As shown, the package has a high density rectangular pitch 147 in the center of the socket. This is translated by the interposer to a larger pitch PCB BGA contact arrangement 151 through the socket. The contacts are distributed around the periphery of the package contacts to make room for other types of connectors in the center of the socket. Alternatively, the socket may also have contacts in the center. As shown, the translated pitch need not be uniform across the PCB BGA contacts.

In addition, a number functional BGA pads 161 are shown. Many types of additional pads may be incorporated into the design of the interposer. In this example, the pads are additional power delivery BGA Pads in the center of the socket. As shown in other examples, this area may also be used for other passive components such as resistors and capacitors.

Figure 10:
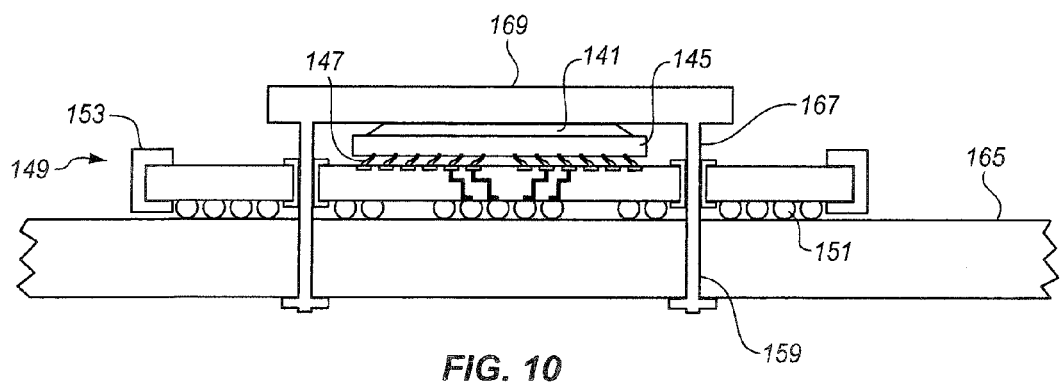
FIG. 10 is a diagram of a cross-sectional side view of the socket of FIG. 7 mounted to a system board according to an embodiment of the present invention.

FIG. 10 shows an example of a framed interposer 149 as in FIGS. 7 and 8 connecting to a die 141 and package substrate 145 and mounted to a system board 165. The example of FIG. 10 is similar to that of FIG. 4 except that the design of the socket has been simplified. In the case of FIG. 10, no LGA bodies are used and the package substrate is connected directly to the interposer 149. As in the example of FIG. 4, in FIG. 10, the package and the socket have been simplified for ease of understanding and may contain many additional components including additional dies, connectors and cooling systems, such as heat fins or liquid cooling plates.

In FIG. 10, a socket is mounted to the top of a motherboard 165 using solder balls 151 on its bottom surface and retention posts 167. The bottom of a package 145 is mounted to a LGA 147 on the top of the socket. The package is held in place in the socket using a compression plate 169 that spans across the top of the package and attaches to retention posts 167 that extend through the socket and the system board.

As with FIG. 4, FIG. 10 shows a compression retention plate 169 secured with mounting posts 167 that run vertically through retention holes 159 in the socket housing toward the socket from the retention plate. In the example of FIG. 4, however, the mounting posts are secured through the bottom substrate of the socket and not to the system board. In the present example, the mounting posts extend through the system board to retain both the socket and the retention plate in place. Either type of socket may be used with either mounting post configuration depending on the particular implementation.

FIG. 10 also shows that the LGA retention holes 159 are positioned internal to the socket housing 153 to reduce the bending moments between the retention plate and the LGA contacts. Because the LGA contact area is reduced in size as compared to a conventional socket, the conventional outer placement of the retention holes, will place the holes a greater distance from the package. This is compensated by moving the holes inward closer to the package and the LGA contact area.

Figure 11:
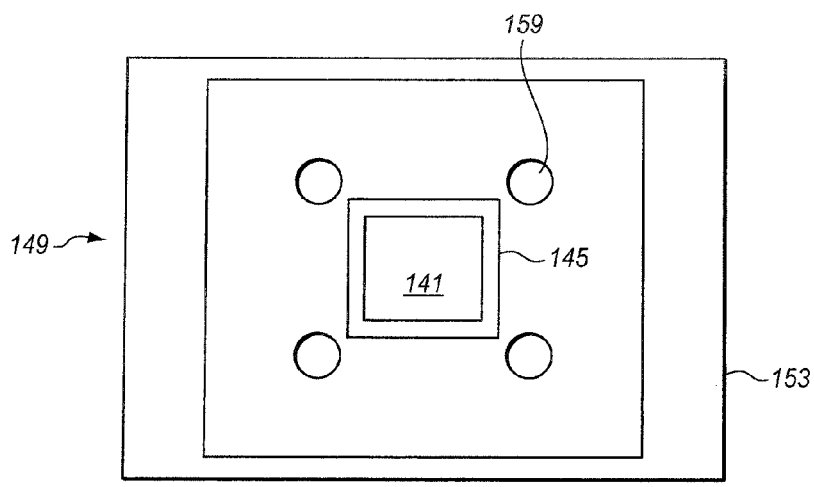
FIG. 11 is a diagram of an alternative top view of the socket of FIG. 10 according to an embodiment of the present invention.

FIG. 11 shows this configuration more clearly, especially in comparison to FIG. 8. As shown in both figures, the die substrate 145 is significantly smaller than the socket frame 153 and the interposer 149 that is carried in the frame. In the FIG. 11 example, which corresponds to FIG. 10, the retention holes 159 are positioned close to the package 145 and die as compared to the retention holes in FIG. 8. Either configuration may be used depending on how the package is to be attached to the socket and the physical properties of the materials being used. For the compression retention plate configuration described above with an LGA contact area, the FIG. 11 configuration may provide a more secure connection between the package and the socket.

Figure 12:
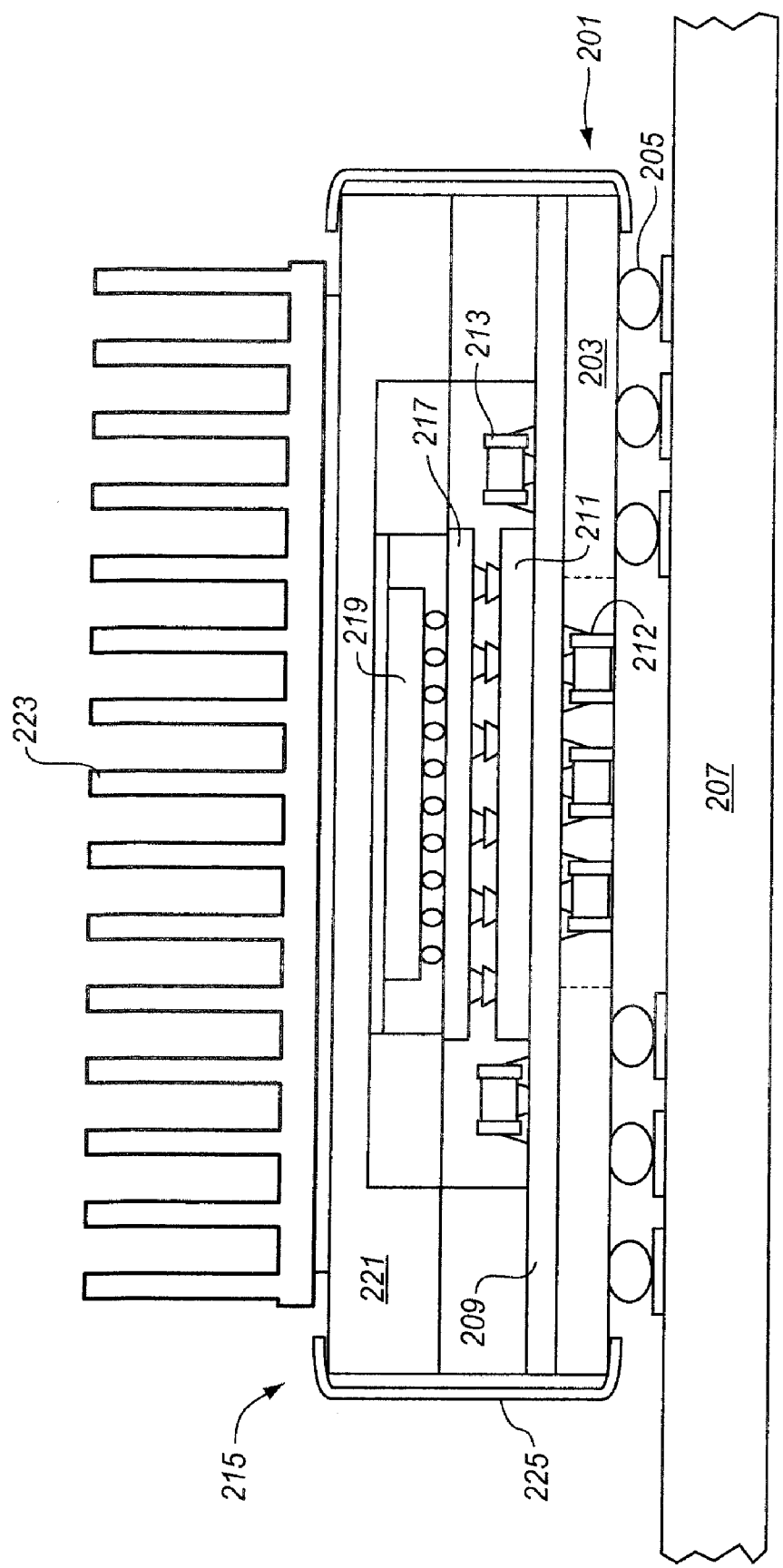
FIG. 12 is a diagram of a cross-sectional side view of another alternative socket with a package and system board according to an embodiment of the present invention.

FIG. 12 shows a further alternative configuration using an interposer or PRM as described above. FIG. 12 also shows a package and socket mounted to a system board in horizontal cross-section. In FIG. 12, a socket 201 includes a frame 203 to carry connections through to solder balls 205. The solder balls form the bottom electrical interface to the top of the system board 207. The socket carries an interposer 209 above the connections to redistribute the package pitch to the system board pitch.

In the illustrated example, the package pitch of 0.5 mm is fanned out to a system board pitch of about 1.27 mm. The particular dimensions of any configuration may vary depending on the implementation and as technology develops. In this example, the greater pin pitch of the socket allows for a central opening in which land side capacitors 212 are mounted. These may be connected through the interposer or socket as desired.

Above the interposer, the socket also carries an LGA substrate 211 or body that carries the LGA connectors to interface with the package. In the illustrated example, the LGA substrate is substantially smaller than the interposer because of the difference in pin pitch. Since the number of pins is about the same and the pin pitch is much smaller, the LGA substrate on the top surface of the socket is much smaller than the BGA on the bottom surface of the socket. Because the LGA substrate is smaller, there is additional unused surface on the top side of the interposer. In the illustrated example, die side capacitors 213 are installed. The interposer and the LGA substrate may contain connections as required to couple the capacitors as desired.

A package 215, for example a Chip Scale Package (CSP) is coupled to the top of the LGA substrate 211 through the LGA connectors. The package in this example includes a package substrate 217 at the bottom of the package connected to the LGA socket substrate 211. A die 219 is coupled to the package substrate through, for example, a BGA. The package also has an integrated heat spreader 221 over the top of the die and connected to the package substrate to seal the die inside the package and protect it against the external environment. The integrated heat spreader also makes thermal contact with the top surface of the die. A heatsink 223 in the form of fins is thermally coupled to the integrated heat spreader to conduct heat away from the die. The heatsink may be air cooled or liquid cooled.

The socket 203 retains the package 215 using a retention device 225 shown as spring clips, however, clamps, screws, and levers of a variety of different kinds may be used. The spring clips extend over a lip on the package and under a lip on the socket to hold the package onto the socket.

The imbedded contact technology described above is capable of smaller pitches than can be achieved by present LGA socket technology. This provides the potential for even smaller packages and therefore lower costs. The pitch translation in the socket decouples a requirement of PCB technology improvements to enable package pitch scaling.

In addition to the reduction in package size, using PCB technology and a layered construction for the socket body enables additional circuit integration into the socket compared to current approaches. Such features may include imbedded shielding, capacitors, resistors, etc. These may be used to improve the high speed, power delivery and density performance of the socket and the system.

The pattern redistribution module may be produced in a variety of different forms. As shown, it may be used as the bottom contact surface of a socket with a connection body mounted on top. Alternatively, it may be used for both contact surfaces of the socket to connect directly to the system board and to the package. As a further alternative, it may be added to an otherwise conventional socket between conventional socket connectors and a package. A variety of other configurations not described herein may also be used.

Thus, sockets and interposers and modules for sockets that allow pin configurations to be changed in a variety of different ways are described. These may be used for packages that contain a wide variety of different dies including processors, controllers, conditioners, power delivery devices, micromechanical devices or other types of devices. The principles described herein may be applied to different types of packages that contain different numbers and type of dies, while only a few different examples are shown herein. The socket modules and interposers are well adapted to be built using printed circuit board and semiconductor processing technologies.

The pin configurations may be changed in pattern, position, density or type and the principles described herein may be applied to a wide range of different connector technologies including LGA, BGA, PGA, or any of a variety of other types of connections and connectors. Although embodiments of the present invention have been described in language specific to structural features or methodological operations, the invention defined in the appended claims is not necessarily limited to the specific features or operations described. The specific features and operations disclosed are used to illustrate rather than limit the present invention.

Particular embodiments may be practiced without one or more of the specific details described, or in combination with other known methods, materials, and apparatuses. In the description, numerous specific details are set forth, such as specific materials, dimensions and material parameters etc. to provide a thorough understanding of the present invention. In other instances, well-known design and fabrication techniques have not been described in particular detail to avoid unnecessarily obscuring the present invention.

Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. For example, a first embodiment may be combined with a second embodiment anywhere the two embodiments are not mutually exclusive.

What is claimed is:

1. A socket comprising:
   an interposer of the socket made from a first material and having a first array of contacts on a first side of the interposer having a first configuration to connect the first array of contacts to an array of contacts on an exterior of a die package so that the contacts of the package exterior are coupled to the system board through the socket;
   a frame of the socket made from a second material and having a second array of contacts on a second side of the frame having a second configuration different from the first configuration to connect the second array of contacts to an array of contacts of a system board;
   a third array of contacts on the second side of the interposer having a different pitch than the first array of contacts on the interposer to connect the die package contacts to the frame so that the die package contacts are coupled to the system board through the interposer and the frame of the socket.

2. The socket of claim 1, wherein the interposer comprises a multi-layer circuit board having conductive traces to connect the contacts of the third array with the contacts of the first array.

3. The socket of claim 2, wherein the interposer has higher density features than the system board.

4. The socket of claim 1, further comprising a contact array body coupled to the interposer, the contact array body connecting the die package contacts to having the first array of contacts and connecting the first array of contacts of the interposer.

5. The socket of claim 3, wherein the first array of contacts is one of a land grid array, a pin grid array and a ball grid array.

6. The socket of claim 1, wherein the second array of contacts comprises an array of solder balls.

7. The socket of claim 1, further comprising passive devices attached to the interposer for signal conditioning.

8. The socket of claim 1, wherein the third array of contacts are formed on the interposer.

9. The socket of claim 1, wherein the interposer translates the arrangement of the contacts between the third array of contacts and the first array of contacts.

10. The socket of claim 1, wherein the second configuration has a lower pin density than the first configuration.

11. The socket of claim 1, wherein the second configuration includes a central area without contacts and the first configuration does not.

12. The socket of claim 11, further comprising passive devices attached to the interposer in the central area.

13. The socket of claim 1, wherein the second configuration is a hexagonal pattern and the first configuration is a rectangular pattern.

14. The socket of claim 1, further comprising a plurality of retention holes through the interposer and the frame to allow the die package to be attached to the interposer.

15. The socket of claim 14, further comprising a clamp to secure the package to the socket though the retention holes.

16. A pattern redistribution module for use in an integrated circuit mounting socket for use in mounting an integrated circuit to an electronic system board, the module comprising:
   an interposer board between a first and a second array of contacts to interconnect contacts of the first array of contacts to contacts of the second array of contacts, the interposer board being made of a first material;
   a first array of contacts on the interposer board having a first configuration to connect to a package containing a die, the first array of contacts corresponding to contacts on an exterior of the package;
   a second array of contacts on a second side of the interposer board having a second configuration different from and having a different pitch from the first configuration to connect to the socket, the second array of contacts corresponding to contacts on the socket;
   a socket frame to connect to the second array of contacts of the interposer board and to the system board so that the contacts of the package exterior are coupled through the interposer board and the socket frame to the system board.

17. The module of claim 16, wherein the interposer board comprises a multiple layer printed circuit board with traces printed on interior layers to connect the contacts.

18. The module of claim 17, wherein traces for power connections are printed on different layers than traces for data connections.

19. The module of claim 16, wherein the second array of contacts has a lower pitch density than the first array of contacts.

20. The module of claim 16, wherein the second array of contacts is a land grid array to present a plurality of lands to connect to the socket.

* * * * *